US012610584B2

(12) United States Patent
Penumatcha et al.

(10) Patent No.: US 12,610,584 B2
(45) Date of Patent: Apr. 21, 2026

(54) SELECTIVE GROWTH OF HIGH-K OXIDE ON CHANNEL OF GATE-ALL-AROUND TRANSISTORS

(71) Applicant: Intel Corporation, Santa Clara, CA (US)

(72) Inventors: Ashish Verma Penumatcha, Beaverton, OR (US); Sarah Atanasov, Beaverton, OR (US); Seung Hoon Sung, Portland, OR (US); Rahul Ramamurthy, Hillsboro, OR (US); I-Cheng Tung, Hillsboro, OR (US); Uygar E. Avci, Portland, OR (US); Matthew V. Metz, Portland, OR (US); Jack T. Kavalieros, Portland, OR (US); Chia-Ching Lin, Portland, OR (US); Kaan Oguz, Portland, OR (US)

(73) Assignee: Intel Corporation, Santa Clara, CA (US)

(*) Notice: Subject to any disclaimer, the term of this patent is extended or adjusted under 35 U.S.C. 154(b) by 1005 days.

(21) Appl. No.: 17/485,238

(22) Filed: Sep. 24, 2021

(65) Prior Publication Data

US 2023/0100505 A1       Mar. 30, 2023

(51) Int. Cl.
    *H10D 30/67*     (2025.01)
    *H10D 30/01*     (2025.01)
    *H10D 64/01*     (2025.01)

(52) U.S. Cl.
    CPC ....... *H10D 30/6735* (2025.01); *H10D 30/031* (2025.01); *H10D 64/01* (2025.01); *H10D 64/021* (2025.01)

(58) Field of Classification Search
None
See application file for complete search history.

(56) References Cited

U.S. PATENT DOCUMENTS

2019/0067441 A1* 2/2019 Yang ...................... H10D 30/43
2019/0123189 A1* 4/2019 Chen ................... H10D 84/853
(Continued)

FOREIGN PATENT DOCUMENTS

EP     3 979 329 A2     4/2022

OTHER PUBLICATIONS

Search Report from European Patent Application No. 22184357.6, mailed Dec. 6, 2022, 13 pgs.

*Primary Examiner* — Sue A Purvis
*Assistant Examiner* — Carnell Hunter, III
(74) *Attorney, Agent, or Firm* — Schwabe, Williamson & Wyatt P.C.

(57) ABSTRACT

Embodiments disclosed herein include transistor devices and methods of forming such devices. In an embodiment, a transistor device comprises a first channel, wherein the first channel comprises a semiconductor material and a second channel above the first channel, wherein the second channel comprises the semiconductor material. In an embodiment, a first spacer is between the first channel and the second channel, and a second spacer is between the first channel and the second channel. In an embodiment, a first gate dielectric is over a surface of the first channel that faces the second channel, and a second gate dielectric is over a surface of the second channel that faces the first channel. In an embodiment, the first gate dielectric is physically separated from the second gate dielectric.

22 Claims, 10 Drawing Sheets

(56)                    References Cited

U.S. PATENT DOCUMENTS

| 2019/0148151 A1 | 5/2019 | Okuno |
| 2020/0220016 A1* | 7/2020 | Guler ................. H10D 84/0158 |
| 2021/0104522 A1 | 4/2021 | Gardner et al. |
| 2021/0184000 A1 | 6/2021 | Ramaswamy |

* cited by examiner

SELECTIVE GROWTH OF HIGH-K OXIDE ON CHANNEL OF GATE-ALL-AROUND TRANSISTORS

TECHNICAL FIELD

Embodiments of the disclosure are in the field of semiconductor structures and processing and, in particular, to gate-all-around transistors with selective high-k oxide deposition.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multigate transistors, such as tri-gate transistors and gate-all-around (GAA) transistors, have become more prevalent as device dimensions continue to scale down. Tri-gate transistors and GAA transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 1A:
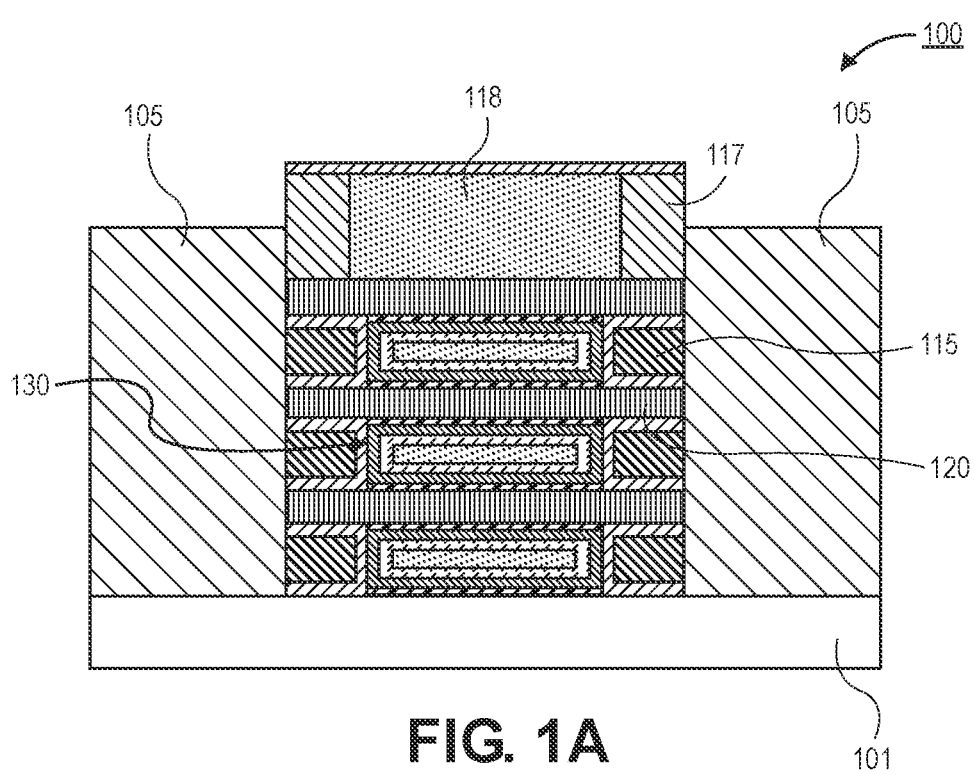
FIG. 1A is a cross-sectional illustration of a gate-all-around (GAA) transistor device.

Embodiments described herein comprise gate-all-around transistors with selective high-k oxide deposition. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

To provide context to the present application, a cross-sectional illustration of a gate-all-around (GAA) transistor device 100 is shown in FIG. 1A. In an embodiment, the transistor device 100 comprises a substrate 101. The substrate 101 may be a semiconductor substrate or the like. A plurality of semiconductor channels 120 may be provided above the substrate 101. The semiconductor channels 120 may extend between source/drain regions 105. In an embodiment, an interior spacer 115 may be provided at the ends of the of gate structure 130. The spacers 115 separate a gate structure 130 from the source/drain regions 105. Top spacers 117 are over the top most channel, and a gate fill metal 118 is between the top spacers 117.

Figure 1B:
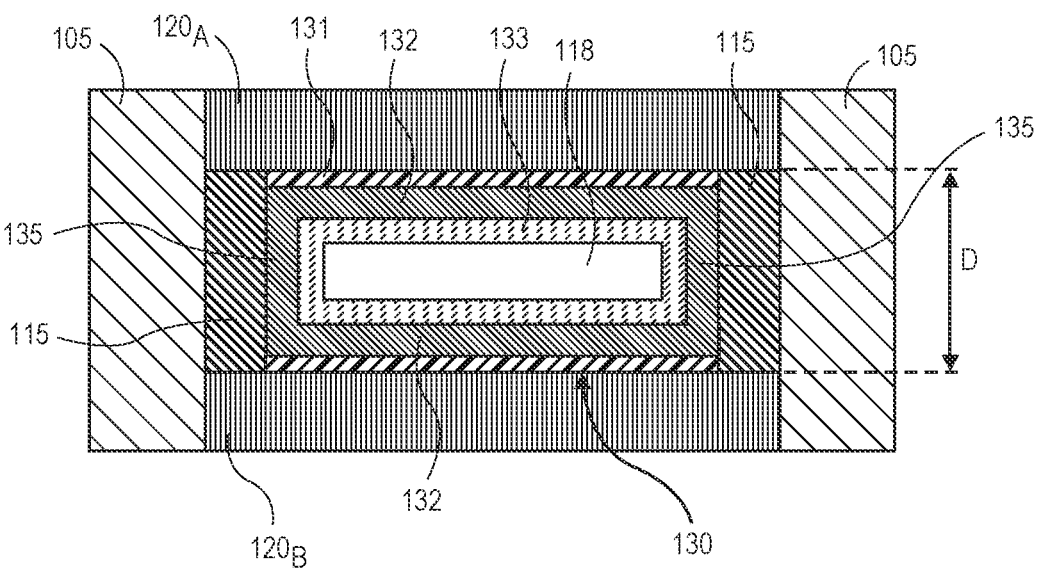
FIG. 1B is a zoomed in illustration of the GAA transistor of FIG. 1A that more clearly illustrates the gate structure around the semiconductor channels.

Referring now to FIG. 1B, a zoomed in illustration that more clearly depicts the gate structure 130 is shown. The gate structure 130 is provided between a pair of semiconductor channels 120. Typically, the space between the channels 120 is constrained. For example, the distance D between the semiconductor channel $120_A$ and the semiconductor channel $120_B$ may be approximately 10 nm or smaller, or approximately 7 nm or smaller. As shown, the gate structure 130 may include an interface layer 131 over and in direct contact with the semiconductor channels 120. For example, the interface layer 131 may comprise silicon and oxygen (e.g., silicon dioxide). A gate dielectric layer 132 may be provided over the interface layer 131. The gate dielectric layer 132 may be a high-k dielectric material. A gate metal 133 may be formed in contact with the gate dielectric layer 132. The gate metal 133 may be a work-function metal. In the illustration, the gate metal 133 is a conformal layer, and lines the interior surfaces of the gate dielectric layer 132. In some instances a fill metal 118 may fill the remainder of the cavity between the semiconductor channels 120.

Typically, the gate dielectric layer 132 is deposited with a conformal deposition process (e.g., atomic layer deposition (ALD)). As such, the gate dielectric layer 132 is deposited along sidewalls of the spacers 115. As shown, vertical portions 135 of the gate dielectric layer 132 are in direct contact with the spacers 115. Particularly, it is noted that the vertical portions 135 of the gate dielectric layer 132 serve no electrical purpose in the transistor device 100. However, the vertical portions 135 result in an increase in the parasitic capacitance of the transistor device 100. As such, the switching speed is slowed down. This decreases the overall frequency of the processor.

Accordingly, embodiments disclosed herein include GAA transistor devices that omit the vertical portions 135 of the gate dielectric layer 132. The vertical portions 135 are omitted by using a selective deposition process. Particularly, a liner is provided around the surfaces of the spacers. The liner is a material that prevents the deposition of the gate dielectric layer 132. As such, the gate dielectric layer 132 will deposit on the interface layer 131 over the semiconductor channels 120 without depositing on the spacers 115. Without the presence of the vertical portions 135, parasitic capacitance is reduced, and device performance is improved.

The removal of the vertical portions 135 also frees up room in the constrained volume between the semiconductor channels. In one embodiment, the extra room is occupied by the spacers 115. That is, the width of the spacers 115 can be increased. Thicker spacers 115 results in a reduction in the parasitic capacitance. In another embodiment, the extra room is occupied by the gate metal 133. Providing more volume for the gate metal 133 lowers the gate resistance.

Accordingly, embodiments provide new architectures for GAA transistor devices that result in an increase in device performance.

Figure 2A:
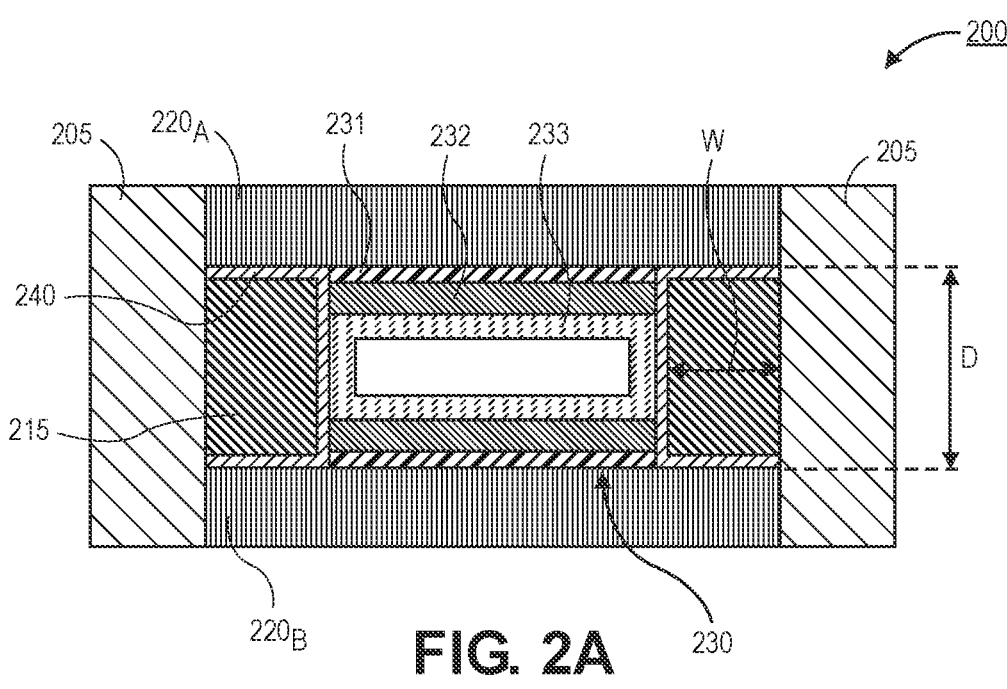
FIG. 2A is a cross-sectional illustration of a GAA transistor with a gate dielectric layer that is selectively deposited over the channel surfaces only in order to provide more space to increase the thickness of the spacers, in accordance with an embodiment.

Referring now to FIG. 2A, a cross-sectional illustration of a portion of a GAA transistor 200 is shown, in accordance with an embodiment. In an embodiment, the transistor 200 may comprise a plurality of semiconductor channels 220. For example, a first semiconductor channel $220_A$ and a second semiconductor channel $220_B$ are shown. But it is to be appreciated that more than two semiconductor channels 220 may be used in other embodiments. In an embodiment, the semiconductor channels 220 may be any suitable semiconductor material. In a particular embodiment, the semiconductor channels 220 comprise silicon. A distance D between the semiconductor channels $220_A$ and $220_B$ may be approximately 10 nm or less, or approximately 7 nm or less. As used herein, "approximately" refers to a value that is within 10% of the stated value. For example, approximately 10 nm may refer to a range between 9 nm and 11 nm. In an embodiment, ends of the semiconductor channels 220 may be connected to source/drain regions 205. In an embodiment, the source/drain regions 205 may be epitaxially grown semiconductor material. The source/drain regions 205 may be heavily doped.

In an embodiment, a gate structure 230 is provided between the semiconductor channels 220. In an embodiment, the gate structure 230 may comprise an interface layer 231. The interface layer 231 may be directly in contact with the semiconductor channels 220. In a particular embodiment, the interface layer 231 comprises silicon and oxygen (e.g., $SiO_X$). In an embodiment, a gate dielectric 232 is provided over the interface layer 231. The gate dielectric 232 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 232 to improve its quality when a high-k material is used.

In contrast to the GAA transistor 100, the gate dielectric 232 only covers the planar surfaces of the interface layer 231, and there is no vertical portion over sidewalls of the spacers 215. Particularly, a liner 240 that is provided over surface of the spacer 215 prevents the deposition of the gate dielectric 232 over the spacers 215. The liner 240 may be over a top surface of the spacer 215, an interior sidewall surface of the spacer 215 (i.e., the surface facing the gate structure 230), and a bottom surface of the spacer 215.

In an embodiment, the deposition process of the gate dielectric 232 (e.g., an ALD process) may not nucleate growth on the liner 240. Generally, the liner 240 comprises a material without a hydroxyl terminated surface. The lack of the hydroxyl terminated surface prevents nucleation of the high-k dielectric chemistry provided in the ALD process. In an embodiment, the liner 240 comprises silicon and nitrogen (e.g., a silicon nitride), or the liner 240 comprises silicon and carbon (e.g., a silicon carbide). In an embodiment, a thickness of the liner 240 may be smaller than a thickness of the gate dielectric 232. For example, a thickness of the liner 240 may be approximately 1 nm or smaller. While shown as providing no gate dielectric growth on the interior sidewall of the spacer 215, it is to be appreciated that a non-significant amount of the gate dielectric 232 may deposit on the liner 240 over the interior sidewalls of the spacer 215.

In an embodiment, a gate metal 233 may line the gate dielectrics 232 and the liner 240. In an embodiment, the gate metal 233 may be a workfunction metal. When the gate metal 233 will serve as an N-type workfunction metal, the gate metal 233 preferably has a workfunction that is between about 3.9 eV and about 4.2 eV. N-type materials that may be used to form the gate metal 233 include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the gate metal 233 will serve as a P-type workfunction metal, the gate metal 233 preferable has a workfunction that is between about 4.9 eV and about 5.2 eV. P-type materials that may be used to form the gate metal 233 include, but are not limited to, ruthenium, palladium, platinum, cobalt, nickel, and conductive metal oxides, e.g., ruthenium oxide.

As noted above, when there is no vertical portion of the gate dielectric 232 (i.e., there is no gate dielectric 232 over vertical sidewalls of the spacers 215), there is extra room in between the semiconductor channels $220_A$ and $220_B$. In the embodiment shown in FIG. 2A, the extra space is occupied by the spacer 215. That is, a width W of the spacers 215 may be increased compared to the spacer dimensions shown in FIG. 1B. For example, a width W of the spacers 215 may be approximately 10 nm or smaller, or approximately 5 nm or smaller. In a particular embodiment, the width W of the spacers 215 may be increased by an amount equal to the thickness of the gate dielectric 232. Increasing the thickness of the spacers 215 results in a lowering of the parasitic capacitance of the transistor 200. As such, switching frequency can be improved.

Figure 2B:
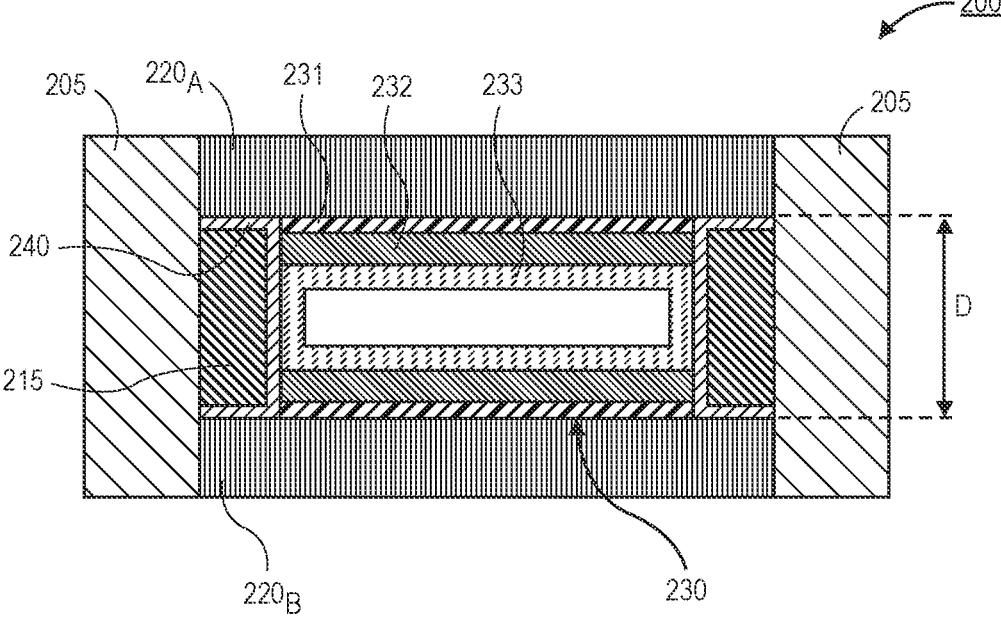
FIG. 2B is a cross-sectional illustration of a GAA transistor with a gate dielectric layer that is selectively deposited over the channel surfaces only in order to provide more space for an increase in the gate metal volume, in accordance with an embodiment.

Referring now to FIG. 2B, a cross-sectional illustration of a GAA transistor 200 is shown, in accordance with an additional embodiment. The transistor 200 in FIG. 2B may be substantially similar to the transistor 200 in FIG. 2A, with the exception of the width of the spacers 215. The extra room provided by omitting vertical portions of the gate dielectric 232 is occupied by the gate metal 233. That is, the gate metal 233 is increased in volume compared to the gate metal 233 shown in FIG. 2A. Increasing the volume of the gate metal 233 results in a decrease in the gate resistance. As such, performance of the GAA transistor 200 is improved.

In FIGS. 2A and 2B, the extra space is occupied by either the spacers 215 or the gate metal 233. However, it is to be appreciated that the extra space may be occupied by increasing the volume of the gate metal 233 and increasing the width of the spacers 215. That is, a balance between increased gate metal 233 volume and increased spacer 215 width may selected in order to provide a desired performance to the transistor 200.

Referring now to FIGS. 3A-3K, a series of cross-sectional illustrations depicting a process for forming a GAA transistor device 300 is shown, in accordance with an embodiment. In the embodiments shown in FIGS. 3A-3K, a transistor device 300 similar to the transistor device 200 shown in FIG. 2B is shown. However, it is to be appreciated that similar processing operations, with minor modifications, can be used to fabricate transistor devices 300 that are similar to any of the embodiments described herein.

Figure 3A:
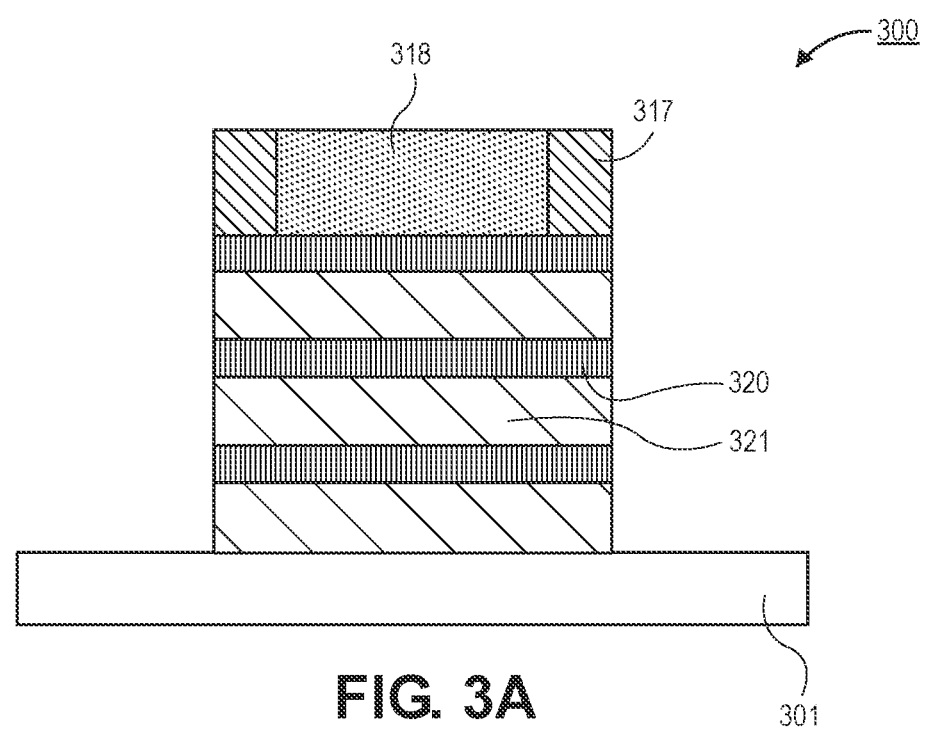
FIG. 3A is a cross-sectional illustration of a stack of semiconductor channels alternating with sacrificial layers, in accordance with an embodiment.

Referring now to FIG. 3A, a cross-sectional illustration of a GAA transistor 300 at a stage of manufacture is shown, in accordance with an embodiment. In an embodiment, a stack of alternating semiconductor channels 320 and sacrificial layers 321 may be provided over a substrate 301. In an embodiment, the underlying substrate 301 represents a general workpiece object used to manufacture integrated circuits. The substrate 301 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In an embodiment, the semiconductor channels 320 and the sacrificial layers 321 may be materials that are etch selective to each other. That is, the sacrificial layers 321 may be etched without significantly etching the semiconductor channels 320. Semiconductor channels 320 and sacrificial layers 321 may each be a material such as, but not limited to, silicon, germanium, SiGe, GaAs, InSb, GaP, GaSb, InAlAs, InGaAs, GaSbP, GaAsSb, and InP. In a specific embodiment, semiconductor channels 320 are silicon and sacrificial layers 321 are SiGe. In another specific embodiment, semiconductor channels 320 are germanium, and sacrificial layers 321 are SiGe.

In an embodiment, a top spacer 317 may be provided over a top most semiconductor layer 320. A sacrificial gate structure 318 may also be provided over the top most semiconductor layer 320. The sacrificial gate structure 318 may be a polysilicon or another sacrificial material. That is, the sacrificial gate structure 318 may be removed in a subsequent processing operation in order to provide access to the semiconductor channels 320.

Figure 3B:
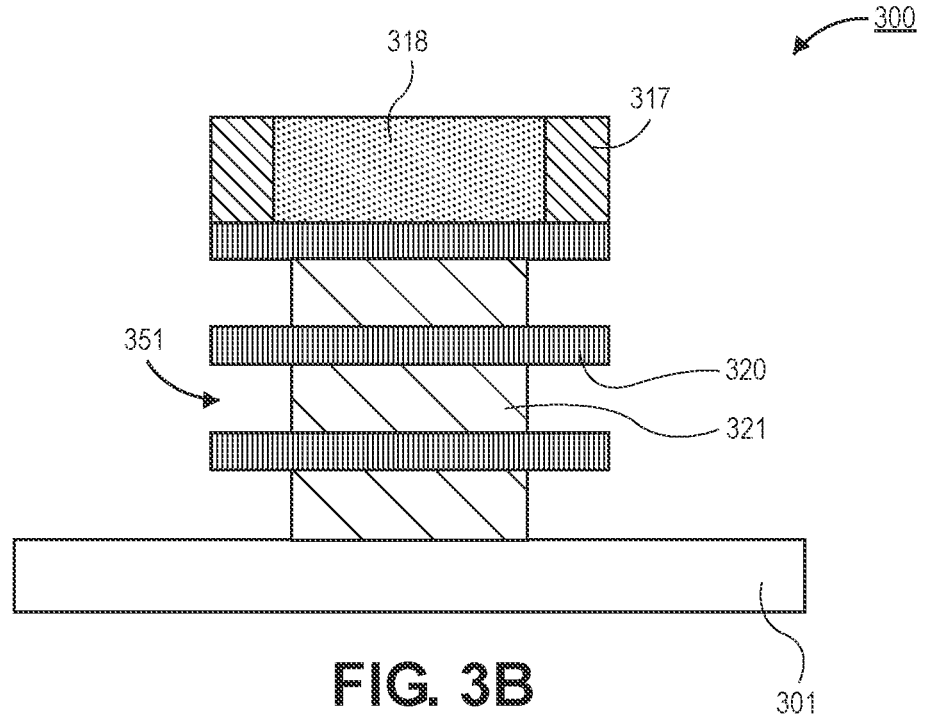
FIG. 3B is a cross-sectional illustration of the structure after the ends of the sacrificial layers are recessed, in accordance with an embodiment.

Referring now to FIG. 3B, a cross-sectional illustration of the transistor 300 at a stage of manufacture is shown, in accordance with an embodiment. In an embodiment, the transistor 300 includes recessed sacrificial layers 321 to form cavities 351. Particularly, the ends of the sacrificial layers 321 are recessed so that a length of the sacrificial layers 321 is smaller than a length of the semiconductor channels 320. In an embodiment, the sacrificial layer 321 may be etched with any suitable etching process. In an embodiment, sacrificial layer 321 is recessed by a timed wet etch process. The selectivity of the etchant is greater than 50:1 for sacrificial layer 321 material over semiconductor channel 320 material. In an embodiment, the selectivity is greater than 100:1. In an embodiment where semiconductor channels 320 are silicon and sacrificial layers 321 are silicon germanium, sacrificial layers 321 are selectively recessed using a wet etchant such as, but not limited to, aqueous carboxylic acid/nitric acid/HF solution and aqueous citric acid/nitric acid/HF solution. In an embodiment where semiconductor channels 320 are germanium and sacrificial layers 321 are silicon germanium, sacrificial layers 320 are selectively recessed using a wet etchant such as, but not limited to, ammonium hydroxide (NH4OH), tetramethylammonium hydroxide (TMAH), ethylenediamine pyrocatechol (EDP), or potassium hydroxide (KOH) solution.

Figure 3C:
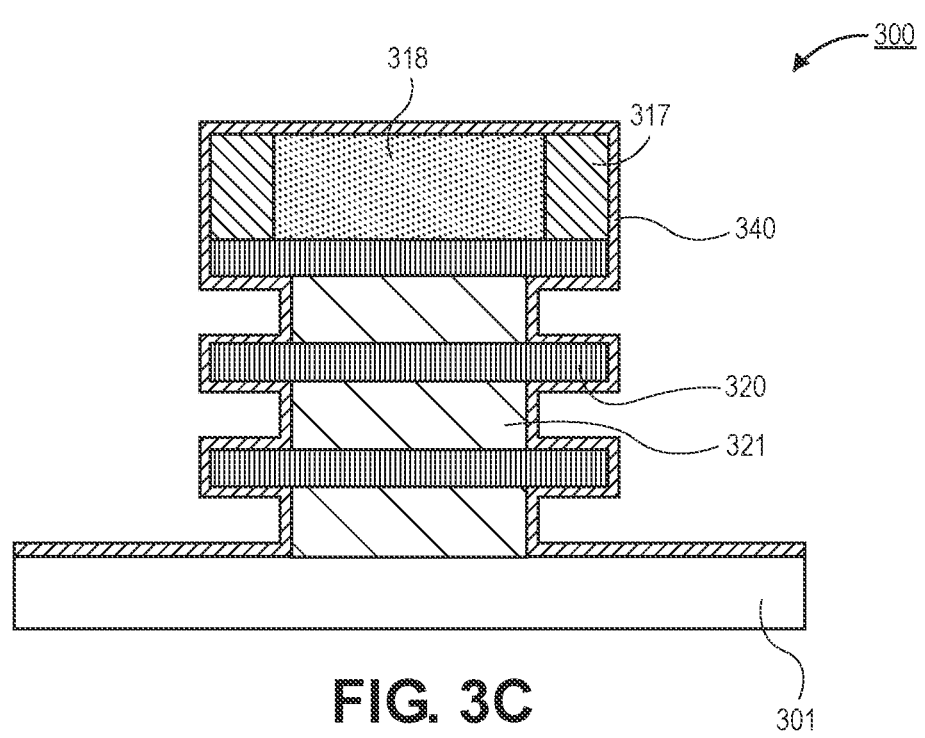
FIG. 3C is a cross-sectional illustration of the structure after a liner is applied over the exposed surfaces, in accordance with an embodiment.

Referring now to FIG. 3C, a cross-sectional illustration of the transistor 300 at a stage of manufacture is shown, in accordance with an embodiment. In an embodiment, the exposed surfaces are covered with a liner 340. The liner 340 may be a conformally deposited material (e.g., a material deposited with ALD or the like). The liner 340 may comprise a material that inhibits the deposition of the material used to form the gate dielectric. For example, the liner 340 may comprise silicon and nitrogen (e.g., a silicon nitride) or silicon and carbon (e.g., a silicon carbide). In an embodiment, the liner 340 may have a thickness that is approximately 1 nm or smaller. In an embodiment, the liner 340 covers the sidewall surfaces of the sacrificial layers 321. Additionally, the liner 340 wraps around the exposed ends of the semiconductor channels 320. The liner 340 may also cover the spacer 317 and sacrificial gate structure 318.

Figure 3D:
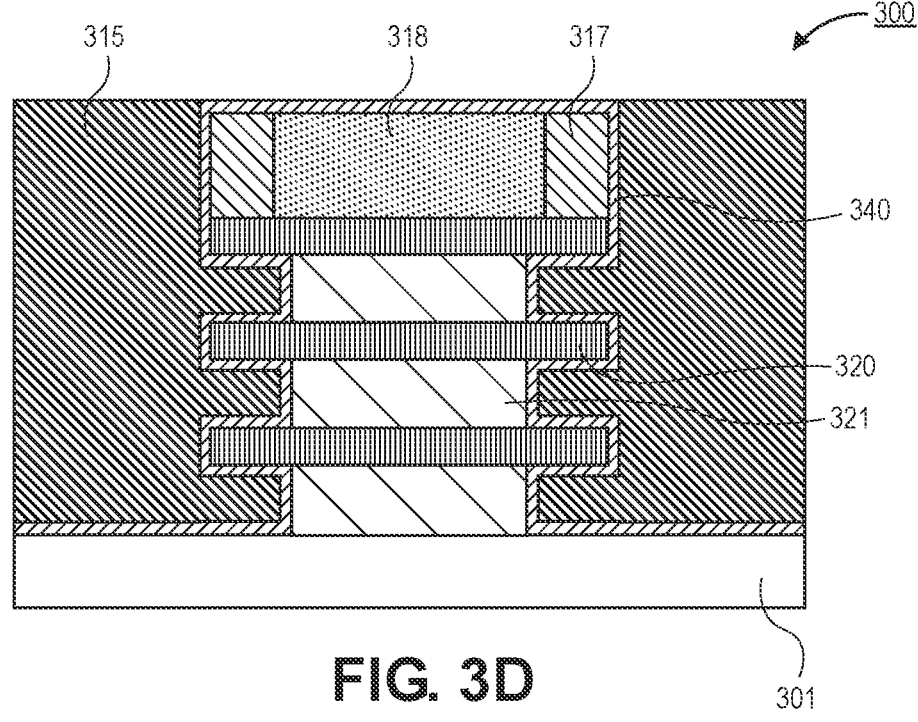
FIG. 3D is a cross-sectional illustration of the structure after an interior spacer layer is deposited, in accordance with an embodiment.

Referring now to FIG. 3D, a cross-sectional illustration of the transistor 300 at a stage of manufacture is shown, in accordance with an embodiment. As shown, a spacer layer 315 is disposed over the substrate 301 and around the stack of semiconductor channels 320 and the sacrificial layers 321. The spacer layer 315 may be any suitable insulating material. In an embodiment, the spacer layer 315 may be an oxide or a nitride. The spacer layer 315 may be deposited with a chemical vapor deposition (CVD) process, an ALD process, or the like.

Figure 3E:
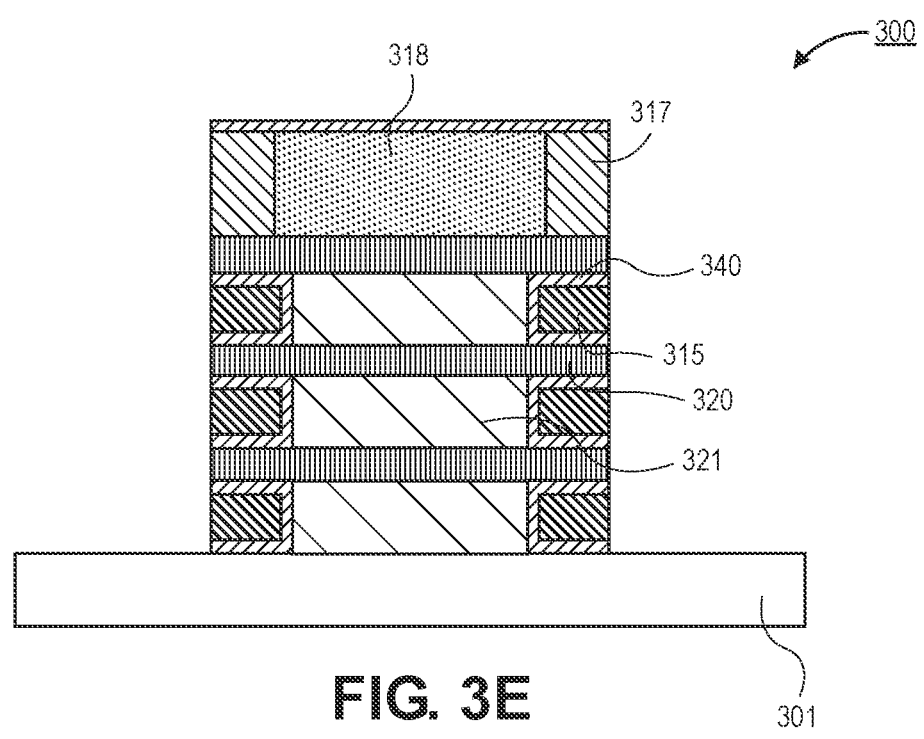
FIG. 3E is a cross-sectional illustration of the structure after the interior spacer layer is recessed, in accordance with an embodiment.

Referring now to FIG. 3E, a cross-sectional illustration of the transistor 300 at a stage of manufacture is shown, in accordance with an embodiment. As shown, the spacer layer 315 is recessed so that only portions of the spacer 315 remain at the ends of the sacrificial layers 321. In an embodiment, the spacer layer 315 may be recessed with an etching process. In an embodiment, the etching process may also remove the liner 340 from over the ends of the semiconductor channels 320. The liner 340 remains over a top surface of the spacer 315, a bottom surface of the spacer 315, and an interior surface of the spacer 315 (i.e., the surface facing the sacrificial layer 321).

Figure 3F:
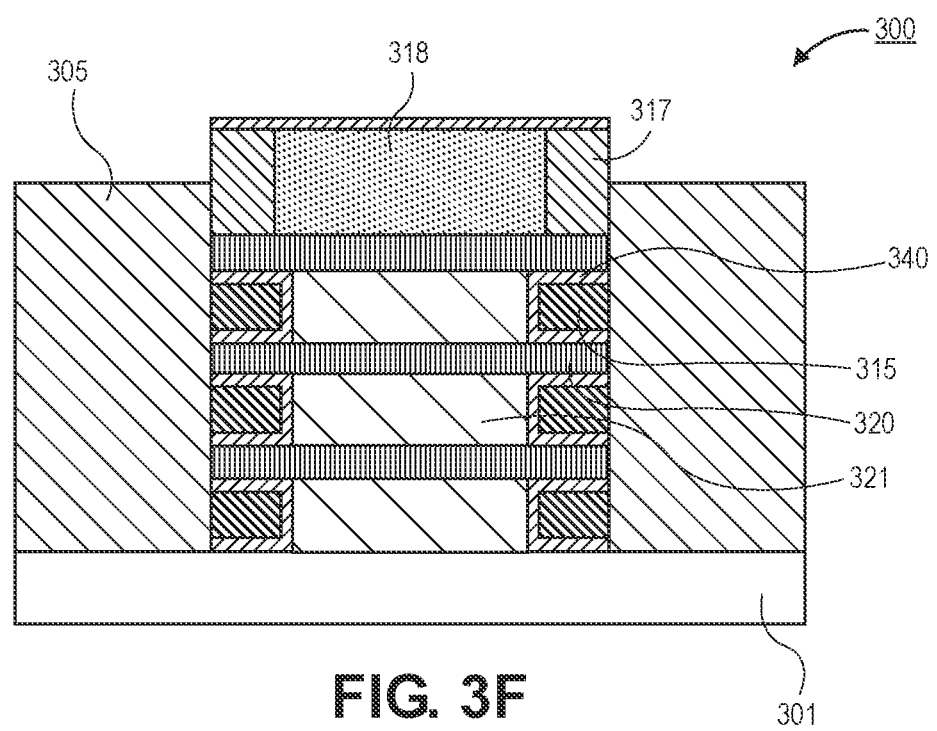
FIG. 3F is a cross-sectional illustration of the structure after a source region and a drain region are formed, in accordance with an embodiment.

Referring now to FIG. 3F, a cross-sectional illustration of the transistor 300 at a stage of manufacture is shown, in accordance with an embodiment. In an embodiment, the transistor 300 may include the growth of source/drain regions 305. The source/drain regions 305 may be epitaxially grown from the ends of the semiconductor channels 320 and/or from the underlying substrate 301. In an embodiment, the source/drain regions 305 may be a silicon alloy such as, an in-situ doped silicon germanium, an in-situ doped silicon carbide, or an in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum. In some implementations, a CVD process may be used for the deposition of the source/drain regions 305.

Figure 3G:
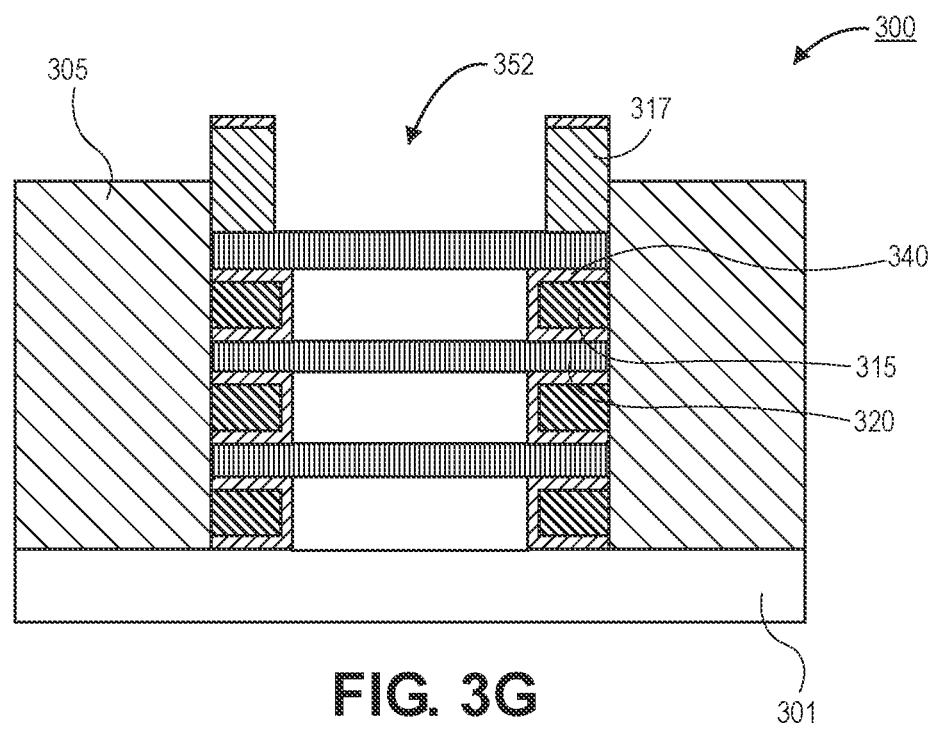
FIG. 3G is a cross-sectional illustration of the structure after the sacrificial layers are removed, in accordance with an embodiment.

Referring now to FIG. 3G, a cross-sectional illustration of the transistor 300 at a stage of manufacture is shown, in accordance with an embodiment. As shown, the sacrificial gate structure 318 is removed, and the sacrificial layers 321 are fully removed. In an embodiment, any suitable etching chemistry, such as those described above, may be used to remove the sacrificial layers 321. Removal of the sacrificial layers 321 results in a cavity 352 that exposes the semiconductor channels 320 and the liner 340 over the interior surface of the spacers 315.

Figure 3H:
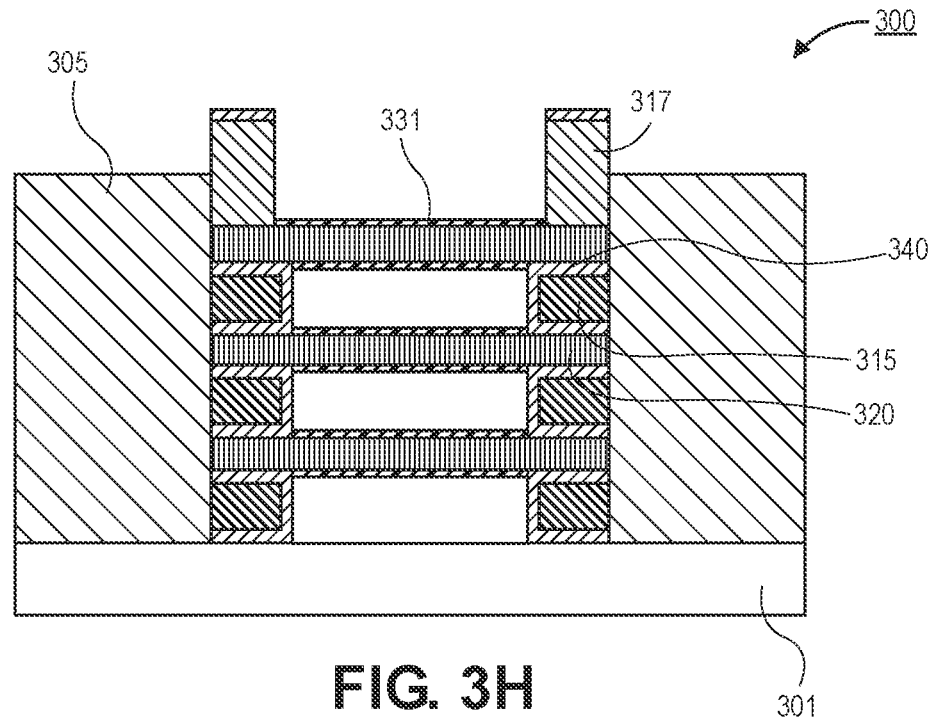
FIG. 3H is a cross-sectional illustration of the structure after an interface layer is disposed over the channels, in accordance with an embodiment.

Referring now to FIG. 3H, a cross-sectional illustration of the transistor 300 at a stage of manufacture is shown, in accordance with an embodiment. As shown, an interface layer 331 is formed over the exposed surfaces of the semiconductor channels 320. In the case of silicon semiconductor channels 320, the interface layer 331 may comprise silicon and oxygen (e.g., $SiO_X$).

Figure 3I:
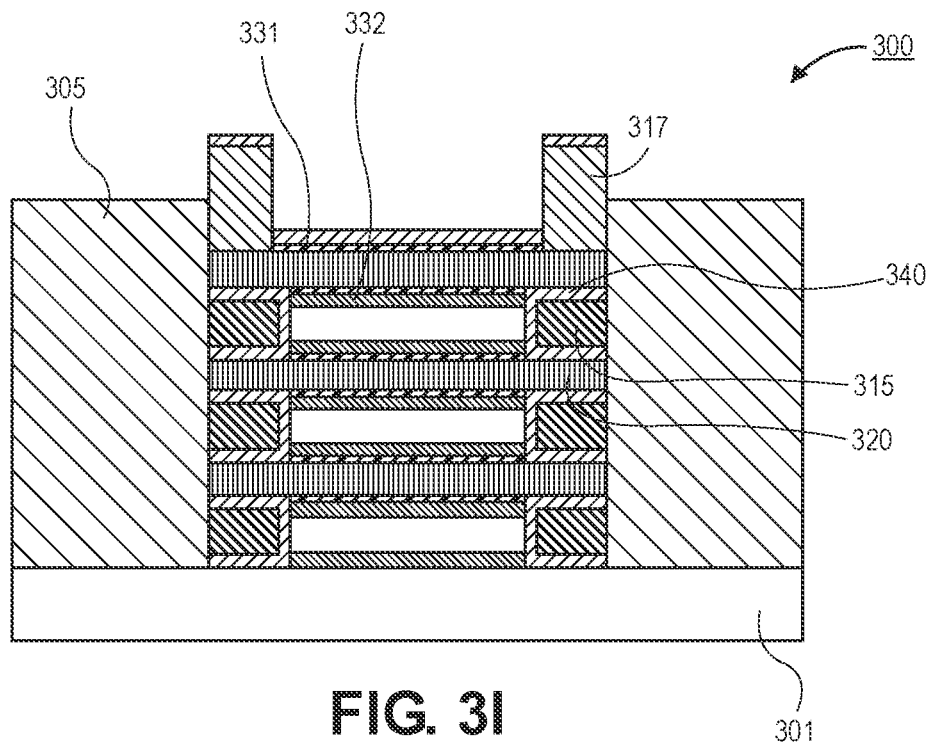
FIG. 3I is a cross-sectional illustration of the structure after a gate dielectric is selectively disposed over the interface layer, in accordance with an embodiment.

Referring now to FIG. 3I, a cross-sectional illustration of the transistor 300 at a stage of manufacture is shown, in accordance with an embodiment. As shown, a gate dielectric 332 is deposited over the interface layers 331. In an embodiment, the gate dielectric 332 may be selectively deposited over the interface layers 331 without depositing along the liner 340 on the interior surface of the spacers 315. As such, there is substantially no vertical portion of the gate dielectric 332. It is to be appreciated that the gate dielectric 332 may contact the liner 340 at the top and bottom of the spacer 315, but this contact arises from the growth of the gate dielectric 332 from the interface layer 331. The gate dielectric 332 may be deposited with a conformal deposition process, such as an ALD process. The material for the gate dielectric 332 may be similar to gate dielectric materials described in greater detail above.

Figure 3J:
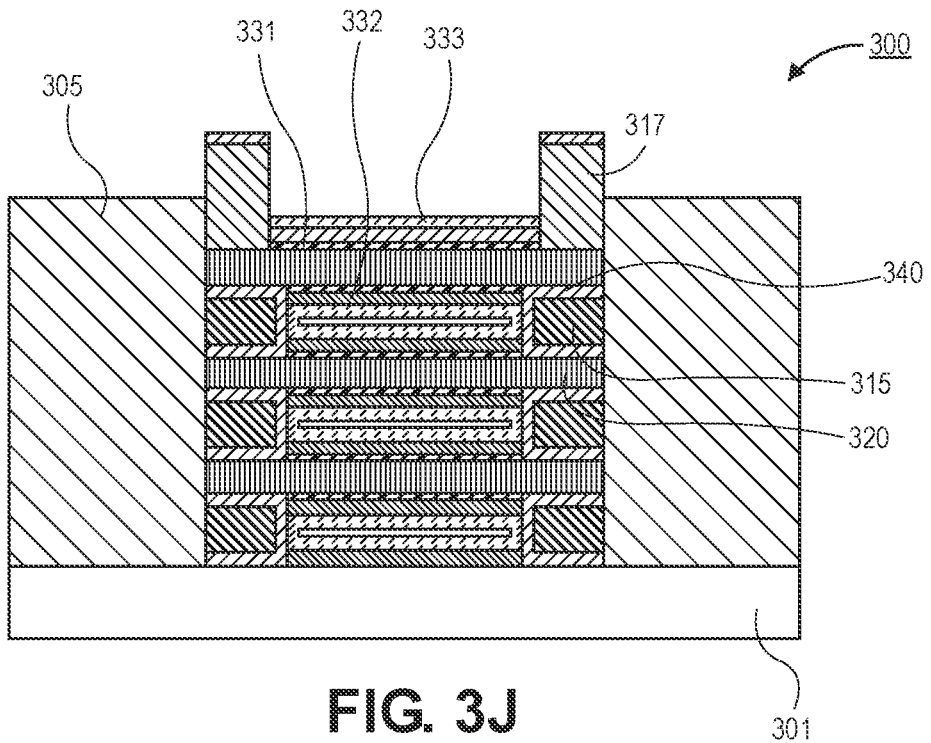
FIG. 3J is a cross-sectional illustration of the structure after a gate metal is deposited, in accordance with an embodiment.

Referring now to FIG. 3J, a cross-sectional illustration of the transistor at a stage of manufacture is shown, in accordance with an embodiment. As shown, a gate metal 333 is deposited over the gate dielectric 332. The gate metal 333 may contact the gate dielectric 332 and the liner 340. Due to the absence of a vertical portion of the gate dielectric 332, the volume of the gate metal 333 may be increased. In an embodiment, the gate metal 333 may be deposited with an ALD process, a CVD process, or the like. In an embodiment, the gate metal 333 may be a workfunction metal, such as the workfunction metals described in greater detail above.

Figure 3K:
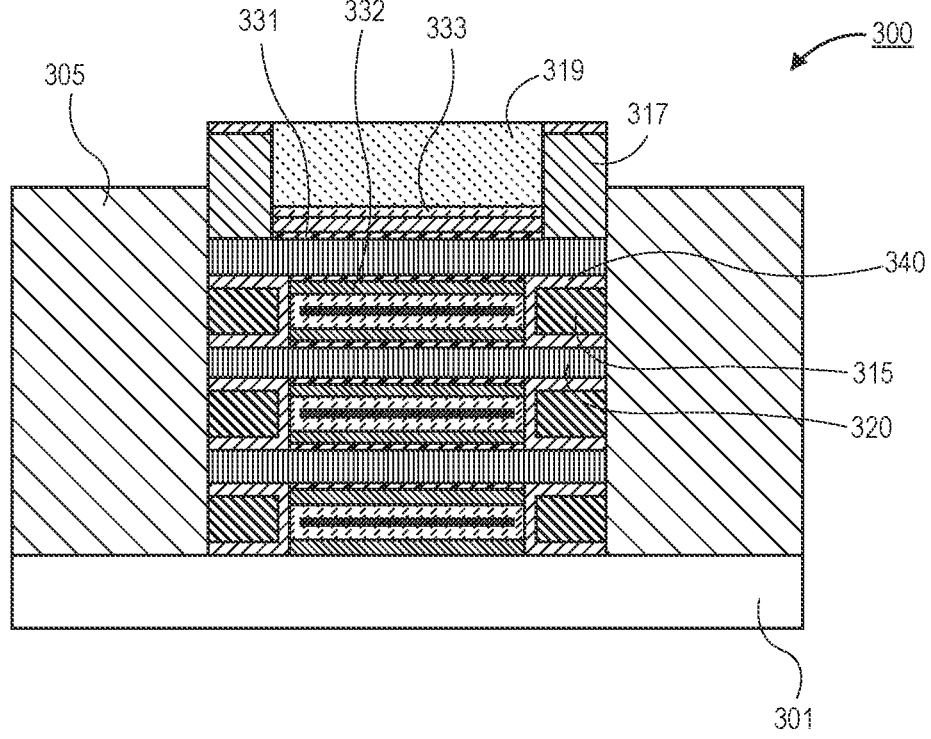
FIG. 3K is a cross-sectional illustration of the structure after a fill metal is deposited, in accordance with an embodiment.

Referring now to FIG. 3K, a cross-sectional illustration of the transistor at a stage of manufacture is shown, in accordance with an embodiment. As shown, a gate fill metal 319 may be disposed over the gate structure. In some embodiments, the gate fill metal 319 may fill cavities between the semiconductor channels 320. The gate fill metal 319 may be provided between the top spacers 317. In an embodiment, the gate fill metal 319 may include materials such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example.

Figure 4:
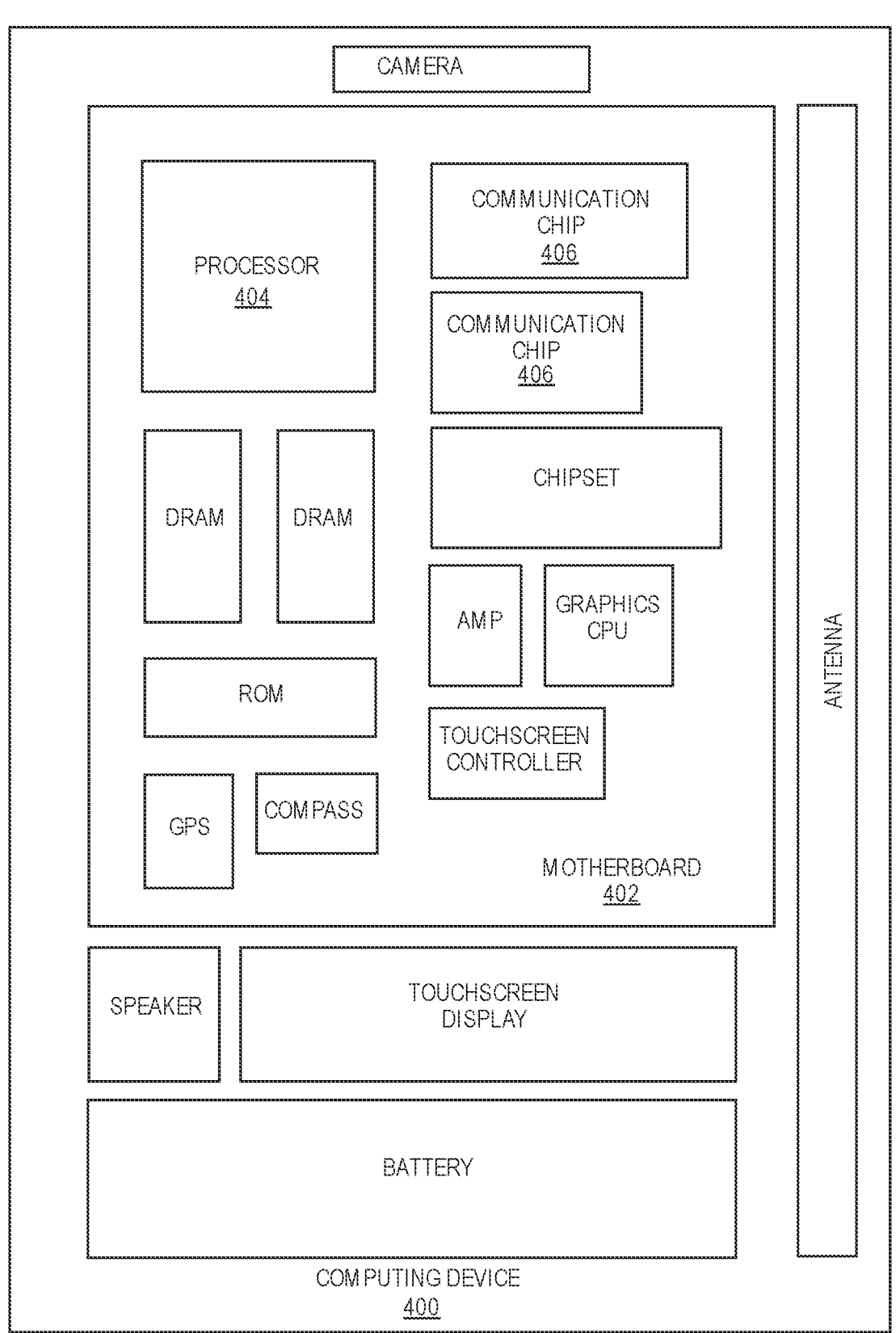
FIG. 4 illustrates a computing device in accordance with one implementation of an embodiment of the disclosure.

FIG. 4 illustrates a computing device 400 in accordance with one implementation of an embodiment of the disclosure. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In an embodiment, the integrated circuit die of the processor may comprise a GAA transistor device with a liner over the interior spacers that prohibits growth of the gate dielectric, as described herein. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In an embodiment, the integrated circuit die of the communication chip may comprise a GAA transistor device with a liner over the interior spacers that prohibits growth of the gate dielectric, as described herein.

In further implementations, another component housed within the computing device 400 may comprise a GAA transistor device with a liner over the interior spacers that prohibits growth of the gate dielectric, as described herein.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
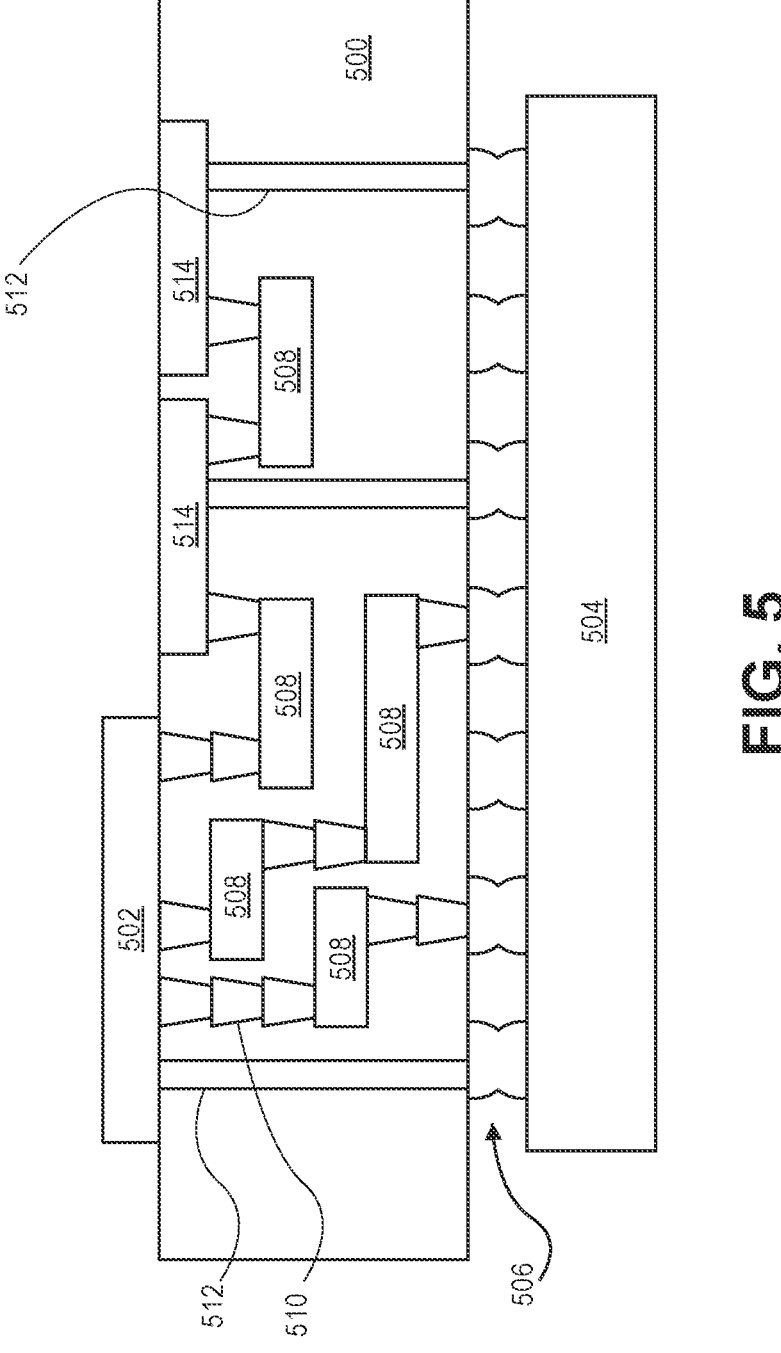
FIG. 5 is an interposer implementing one or more embodiments of the disclosure.

FIG. 5 illustrates an interposer 500 that includes one or more embodiments of the disclosure. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. In an embodiment, one of both of the first substrate 502 and the second substrate 504 may comprise a GAA transistor device with a liner over the interior spacers that prohibits growth of the gate dielectric, in accordance with embodiments described herein. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer 500 may be formed of alternate rigid or flexible materials that may include the same materials described above for use in a semiconductor substrate, such as silicon, germanium, and other group III-V and group IV materials.

The interposer 500 may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the disclosure, apparatuses or processes disclosed herein may be used in the fabrication of interposer 500.

Thus, embodiments of the present disclosure may comprise a GAA transistor device with a liner over the interior spacers that prohibits growth of the gate dielectric.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a transistor device, comprising: a first channel, wherein the first channel comprises a semiconductor material; a second channel above the first channel, wherein the second channel comprises the semiconductor material; a first spacer between the first channel and the second channel; a second spacer between the first channel and the second channel; a first gate dielectric over a surface of the first channel that faces the second channel; and a second gate dielectric over a surface of the second channel that faces the first channel, wherein the first gate dielectric is physically separated from the second gate dielectric.

Example 2: the transistor device of Example 1, further comprising a first interface layer between the first gate dielectric and the surface of the first channel and a second interface layer between the second gate dielectric and the second channel.

Example 3: the transistor device of Example 2, wherein the first interface layer and the second interface layer comprise silicon and oxygen.

Example 4: the transistor device of Examples 1-3, further comprising: a liner around the first spacer and the second spacer.

Example 5: the transistor device of Example 4, wherein the liner covers three surfaces of the first spacer and three surfaces of the second spacer.

Example 6: the transistor device of Example 4 or Example 5, wherein the liner comprises silicon and nitrogen.

Example 7: the transistor device of Example 4 or Example 5, wherein the liner comprises silicon and carbon.

Example 8: the transistor device of Examples 4-7, wherein a thickness of the liner is smaller than a thickness of the first gate dielectric.

Example 9: the transistor device of Example 8, wherein the thickness of the liner is 1 nm or smaller.

Example 10: the transistor device of Examples 1-9, further comprising: a metal layer between the first channel and the second channel.

Example 11: the transistor device of Example 10, wherein the metal layer is over the first channel, the second channel, the first spacer, and the second spacer.

Example 12: the transistor device of Examples 1-11, wherein a distance between the first channel and the second channel is approximately 10 nm or smaller.

Example 13: a method of forming a transistor device, comprising: forming a stack, wherein the stack comprises a plurality of channels that alternate with a plurality of sacrificial layers; recessing ends of the sacrificial layers; disposing a liner on the sacrificial layers and around ends of the plurality of channels; disposing spacers adjacent to the ends of the sacrificial layers; forming a source region and a drain region on opposite ends of the plurality of channels, wherein the source region and the drain region directly contact the plurality of channels; removing the sacrificial layers; disposing a gate dielectric over the plurality of channels, wherein the gate dielectric does not substantially deposit on the liner over the spacers; and disposing a gate metal over the gate dielectric.

Example 14: the method of Example 13, wherein the liner has a thickness that is less than a thickness of the gate dielectric.

Example 15: the method of Example 14, wherein the thickness of the liner is 1 nm or smaller.

Example 16: the method of Examples 13-15, wherein the liner comprises a material without a hydroxyl terminated surface.

Example 17: the method of Example 16, wherein the liner comprises silicon and carbon or silicon and nitrogen.

Example 18: the method of Examples 13-17, wherein the gate metal is separated from the spacer by the liner.

Example 19: the method of Examples 13-18, wherein the liner wraps around the spacers.

Example 20: the method of Example 19, wherein the liner is over a top surface of the spacers, an interior surface of the spacers, and a bottom surface of the spacers.

Example 21: the method of Examples 13-19, wherein a distance between the plurality of channels is approximately 10 nm or smaller.

Example 22: an electronic system, comprising: a board; a package substrate coupled to the board; and a die coupled to the package substrate, wherein the die comprise a transistor device, comprising: a first channel, wherein the first channel comprises a semiconductor material; a second channel above the first channel, wherein the second channel comprises the semiconductor material; a first spacer between the first channel and the second channel; a second spacer between the first channel and the second channel; a first gate dielectric over a surface of the first channel that faces the second channel; and a second gate dielectric over a surface of the second channel that faces the first channel, wherein the first gate dielectric is physically separated from the second gate dielectric.

Example 23: the electronic system of Example 22, further comprising: a liner around the first spacer and the second spacer.

Example 24: the electronic system of Example 23, wherein the liner covers three surfaces of the first spacer and three surfaces of the second spacer, and wherein trace amounts of a gate dielectric material are provided over vertical surfaces of the liner.

Example 25: the electronic system of Example 23 or Example 24, wherein the liner comprises silicon and nitrogen, or silicon and carbon.

What is claimed is:

1. A transistor device, comprising:
a first channel, wherein the first channel comprises a semiconductor material;
a second channel above the first channel, wherein the second channel comprises the semiconductor material;
a first spacer between the first channel and the second channel;
a second spacer between the first channel and the second channel;
a liner adjacent to the first spacer and the second spacer;
a first gate dielectric over a surface of the first channel that faces the second channel;
a second gate dielectric over a surface of the second channel that faces the first channel, wherein the first gate dielectric is physically separated from the second gate dielectric; and
a metal layer between the first channel and the second channel, the metal layer in direct physical contact with the liner.

2. The transistor device of claim 1, further comprising a first interface layer between the first gate dielectric and the surface of the first channel and a second interface layer between the second gate dielectric and the second channel.

3. The transistor device of claim 2, wherein the first interface layer and the second interface layer comprise silicon and oxygen.

4. The transistor device of claim 1, wherein the liner covers three surfaces of the first spacer and three surfaces of the second spacer.

5. The transistor device of claim 1, wherein the liner comprises silicon and nitrogen.

6. The transistor device of claim 1, wherein the liner comprises silicon and carbon.

7. The transistor device of claim 1, wherein a thickness of the liner is smaller than a thickness of the first gate dielectric.

8. The transistor device of claim 7, wherein the thickness of the liner is 1 nm or smaller.

9. The transistor device of claim 1, wherein the metal layer is over the first channel, the second channel, the first spacer, and the second spacer.

10. The transistor device of claim 1, wherein a distance between the first channel and the second channel is approximately 10 nm or smaller.

11. A method of forming a transistor device, comprising:
forming a stack, wherein the stack comprises a plurality of channels that alternate with a plurality of sacrificial layers;
recessing ends of the sacrificial layers;
disposing a liner on the sacrificial layers and around ends of the plurality of channels;
disposing spacers adjacent to the ends of the sacrificial layers;
forming a source region and a drain region on opposite ends of the plurality of channels, wherein the source region and the drain region directly contact the plurality of channels;
removing the sacrificial layers;
disposing a gate dielectric over the plurality of channels, wherein the gate dielectric does not substantially deposit on the liner over the spacers; and disposing a gate metal over the gate dielectric, the gate metal in direct physical contact with the liner.

12. The method of claim 11, wherein the liner has a thickness that is less than a thickness of the gate dielectric.

13. The method of claim 12, wherein the thickness of the liner is 1 nm or smaller.

14. The method of claim 11, wherein the liner comprises a material without a hydroxyl terminated surface.

15. The method of claim 14, wherein the liner comprises silicon and carbon or silicon and nitrogen.

16. The method of claim 11, wherein the gate metal is separated from the spacer by the liner.

17. The method of claim 11, wherein the liner wraps around the spacers.

18. The method of claim 17, wherein the liner is over a top surface of the spacers, an interior surface of the spacers, and a bottom surface of the spacers.

19. The method of claim 11, wherein a distance between the plurality of channels is approximately 10 nm or smaller.

20. An electronic system, comprising:
   a board;
   a package substrate coupled to the board; and
   a die coupled to the package substrate, wherein the die comprise a transistor device, comprising:
      a first channel, wherein the first channel comprises a semiconductor material;

a second channel above the first channel, wherein the second channel comprises the semiconductor material;
      a first spacer between the first channel and the second channel;
      a second spacer between the first channel and the second channel;
   a liner adjacent to the first spacer and the second spacer;
      a first gate dielectric over a surface of the first channel that faces the second channel;
      a second gate dielectric over a surface of the second channel that faces the first channel, wherein the first gate dielectric is physically separated from the second gate dielectric; and
      a metal layer between the first channel and the second channel, the metal layer in direct physical contact with the liner.

21. The electronic system of claim 20, wherein the liner covers three surfaces of the first spacer and three surfaces of the second spacer, and wherein trace amounts of a gate dielectric material are provided over vertical surfaces of the liner.

22. The electronic system of claim 20, wherein the liner comprises silicon and nitrogen, or silicon and carbon.

* * * * *